United States Patent
Shimizu et al.

(10) Patent No.: US 11,703,838 B2
(45) Date of Patent: *Jul. 18, 2023

(54) SUBSTRATE MANUFACTURING MACHINE AND SUBSTRATE MANUFACTURING LINE

(71) Applicant: FUJI CORPORATION, Chiryu (JP)

(72) Inventors: Koji Shimizu, Gamagori (JP); Michihiko Tajima, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 25 days.

This patent is subject to a terminal disclaimer.

(21) Appl. No.: 17/365,566

(22) Filed: Jul. 1, 2021

(65) Prior Publication Data
US 2021/0325858 A1    Oct. 21, 2021

Related U.S. Application Data

(63) Continuation of application No. 16/485,678, filed as application No. PCT/JP2017/005383 on Feb. 14, 2017, now Pat. No. 11,092,947.

(51) Int. Cl.
*G05B 19/418*    (2006.01)
*H05K 13/08*    (2006.01)

(52) U.S. Cl.
CPC ... *G05B 19/41865* (2013.01); *G05B 19/4183* (2013.01); *H05K 13/085* (2018.08); *H05K 13/0882* (2018.08)

(58) Field of Classification Search
CPC .......... G05B 19/41865; G05B 19/4183; G05B 19/418; H05K 13/085; H05K 13/0882; H05K 13/00; Y02P 90/02
See application file for complete search history.

(56) References Cited

U.S. PATENT DOCUMENTS

| | | |
|---|---|---|
| 5,231,585 A | 7/1993 | Kobayashi |
| 2004/0122859 A1* | 6/2004 | Gavra ................ H01L 22/20 |

(Continued)

FOREIGN PATENT DOCUMENTS

| | | |
|---|---|---|
| EP | 3 043 629 A1 | 7/2016 |
| EP | 3 107 364 A1 | 12/2016 |

(Continued)

OTHER PUBLICATIONS

Extended European Search Report dated Feb. 21, 2020 in European Patent Application No. 17896962.2, 8 pages.

(Continued)

*Primary Examiner* — Ziaul Karim
(74) *Attorney, Agent, or Firm* — Oblon, McClelland, Maier & Neustadt, L.L.P.

(57) ABSTRACT

A substrate manufacturing machine (component mounter) includes a substrate type setting section configured to set next and subsequent substrate types to be manufactured subsequently to a current substrate type currently being manufactured, a substrate type checking section configured to check whether the set next and subsequent substrate types are correct, a manufacturing condition investigation section configured to examine whether a manufacturing condition for manufacturing substrates of the next and subsequent substrate types is satisfied, and a manufacturing authorization section configured to authorize manufacturing of the substrates of the next and subsequent substrate types in a case where the next and subsequent substrate types are correct and the manufacturing condition is satisfied.

5 Claims, 5 Drawing Sheets

(56) References Cited

U.S. PATENT DOCUMENTS

| | | | | |
|---|---|---|---|---|
| 2008/0074678 A1* | 3/2008 | Willis | ................... | G03F 7/0392 |
| | | | | 356/601 |
| 2008/0077352 A1* | 3/2008 | Willis | ................ | G03F 7/70625 |
| | | | | 702/155 |
| 2008/0077362 A1* | 3/2008 | Willis | ................ | G03F 7/70516 |
| | | | | 356/601 |
| 2016/0212898 A1* | 7/2016 | Ohashi | ............... | H05K 13/0882 |
| 2016/0345475 A1* | 11/2016 | Iisaka | ................... | H05K 13/08 |

FOREIGN PATENT DOCUMENTS

| | | |
|---|---|---|
| JP | H04-347769 A | 12/1992 |
| JP | 10-229293 A | 8/1998 |
| JP | 2003-69296 A | 3/2003 |
| JP | 2004-134691 A | 4/2004 |
| JP | 2007-299804 A | 11/2007 |
| JP | 2010-244506 A | 10/2010 |
| JP | 2014-165440 A | 9/2014 |
| JP | 2015-56160 A | 3/2015 |
| JP | 2017-34142 A | 2/2017 |

OTHER PUBLICATIONS

International Search Report dated Apr. 4, 2017 in PCT/JP2017/005383 filed Feb. 14, 2017.

* cited by examiner

SUBSTRATE MANUFACTURING MACHINE AND SUBSTRATE MANUFACTURING LINE

CROSS-REFERENCE TO RELATED APPLICATIONS

This application is a continuation application of U.S. application Ser. No. 16/485,678, filed Aug. 13, 2019, which is a National Stage Application of International Application No. PCT/JP2017/005383, filed Feb. 14, 2017, the entire contents of which is incorporated herein by reference.

TECHNICAL FIELD

The present application relates to a substrate manufacturing machine for manufacturing substrates on which electronic components (hereinafter, referred to as "component") are mounted, and a substrate manufacturing line that includes multiple substrate manufacturing machines which share the manufacturing of the substrate.

BACKGROUND ART

Examples of a substrate manufacturing machine which manufactures a substrate on which a large number of components are mounted include a solder printing machine, a component mounter, a reflow machine, a substrate inspection machine, and the like. In general, a substrate manufacturing line is configured by connecting these substrate manufacturing machines. Further, in many cases, a line management device which manages progress of the manufacturing is provided. Generally, when switching a type of the substrate (substrate type) to be manufactured on the substrate manufacturing line, it is necessary to change manufacturing job data for each substrate manufacturing machine. The manufacturing job data describes detailed specifications of a manufacturing operation of the substrate manufacturing machine. The manufacturing job data differs for each type of the substrate manufacturing machines and for each substrate type. Patent literature 1 discloses a technical example relating to a method of managing the manufacturing job data when switching the substrate type.

A manufacturing management device of patent literature 1 includes means for editing an NC program (manufacturing job data), means for transmitting the NC program to a component mounter, and means for notifying an operator of the determination result, in a case where it is determined that there is no manufacturing record by referring to a manufacturing record flag provided in the NC program, and inquiring of the operator about whether transmission is authorized. With this, it is possible to prevent in advance a defective product, being not intended by the operator, from being manufactured due to the data change of the NC program.

PATENT LITERATURE

Patent Literature 1: JP-A-2014-165440

BRIEF SUMMARY

Technical Problem

An order of the substrate types to be manufactured is formulated by a manufacturing manager and distributed to the relevant departments in a form of a manufacturing plan. Alternatively, the order of the substrate types to be manufactured is transmitted to the relevant departments online in a form of manufacturing planning data. The operator refers to the manufacturing plan or the manufacturing planning data to set the types of the substrates to be produced subsequently (subsequent substrate types). At this time, a manual selection operation is performed by the operator, or an automatic selection function is used. In a case of the manual selection operation, the operator refers to the manufacturing plan and the manufacturing planning data, and selects data corresponding to the subsequent substrate types from among multiple pieces of manufacturing job data.

Here, in many cases, names of the multiple pieces of manufacturing job data are similar to each other, and there is a possibility that an operator may erroneously select the manufacturing job data. Further, in a case where a separate manufacturing job is each defined on a front surface and a back surface of one substrate, it is difficult to rule it out that the operator mixes up the front surface and the back surface. Further, even in a case of manufacturing job data of the same substrate type, there may be multiple pieces of the manufacturing job data having a change history. In this case, the manufacturing job data other than the latest revision may be erroneously selected. Further, in a case where the latest revision is prohibited from being used for some reason, there is a possibility that the manufacturing job data of an old revision to be used by the operator cannot be selected.

On the other hand, the manufacturing plan can be changed. For example, a substrate type for which a manufacturing request is made in an emergency is incorporated into an initial manufacturing plan. Further, for example, when procurement of a component is delayed, the manufacturing order of the substrate type, on which the component is mounted, becomes delayed. Such a change in the manufacturing plan is notified to the operator by notification of the change of the manufacturing plan or update of the manufacturing planning data. However, the operator cannot recognize the change in the manufacturing plan due to the time delay of the notification or the like, and may set the subsequent substrate types erroneously.

In consideration of the above-mentioned artificial setting error or the change in the manufacturing plan, a technique of patent literature 1 cannot determine whether the setting of the subsequent substrate types is correct. Even if the set subsequent substrate types are correct, the actual manufacturing is not started unless a manufacturing condition is satisfied. In this case, there is room for the change in the manufacturing plan. For example, in a case where temporary maintenance is required for a certain substrate manufacturing line, it is possible to direct the set subsequent substrate types to another substrate manufacturing line.

If the manufacturing is started with the setting of the erroneous subsequent substrate types, a malfunction occurs or manufacturing completion time is delayed, resulting in a large loss. Further, even if it is noticed before the start of the manufacturing, a setup changing work performed in association with the erroneous substrate type becomes wasteful.

An object of the present description is to provide a substrate manufacturing machine and a substrate manufacturing line capable of coping with an artificial setting error or a change in a manufacturing plan and starting manufacturing after checking that the set subsequent substrate types are correct.

Solution to Problem

The present description discloses a substrate manufacturing machine including: a substrate type setting section configured to set subsequent substrate types to be manufactured subsequently next to a current substrate type currently being manufactured; a substrate type checking section configured to check whether the set subsequent substrate types are correct; a manufacturing condition examination section configured to examine whether a manufacturing condition for manufacturing substrates of the subsequent substrate types is satisfied; and a manufacturing authorization section configured to authorize manufacturing of the substrates of the subsequent substrate types in a case where the subsequent substrate types are correct and the manufacturing condition is satisfied.

In the present description, the "subsequent substrate types to be manufactured subsequently" means both of a case of only "a next substrate type to be manufactured next" and a case of two or more substrate types including the "after-next substrate type to be manufactured after the next".

In addition, the present description discloses a substrate manufacturing line including: multiple substrate manufacturing machines configured to share manufacturing of a substrate; and a line management device, in which the line management device includes a substrate type setting section configured to set subsequent substrate types to be manufactured subsequently next to a current substrate type currently being manufactured, a substrate type checking section configured to check whether the set subsequent substrate types are correct, a manufacturing condition examination section configured to examine whether a manufacturing condition for manufacturing the substrates of the subsequent substrate types is satisfied, and a manufacturing authorization section configured to authorize manufacturing of the substrates of the subsequent substrate types in a case where the subsequent substrate types are correct and the manufacturing condition is satisfied in all the substrate manufacturing machines.

Advantageous Effects

With the substrate manufacturing machine disclosed in the present description, whether the set subsequent substrate types are correct is checked, whether the manufacturing condition is satisfied is examined, and the manufacturing of the substrate is authorized in a case where the subsequent substrate types are correct and the manufacturing condition is satisfied. Therefore, if the set subsequent substrate types are erroneous, the manufacturing of the substrate is not authorized. In a case where the manufacturing condition is not satisfied even if the set subsequent substrate types are correct, the manufacturing of the substrate is not authorized because there is a possibility of a change in the manufacturing plan, in other words, there is room for a change in the subsequent substrate types. Therefore, it is possible to cope with an artificial setting error or a change in the manufacturing plan and to start manufacturing after checking that the set subsequent substrate types are correct.

Also in the substrate manufacturing line disclosed in the present description, the permission and the non-permission of the manufacturing of the substrate are determined in the same manner as in the substrate manufacturing machine described above. Therefore, it is possible to cope with an artificial setting error or a change in the manufacturing plan and to start manufacturing after checking that the set subsequent substrate types are correct.

DESCRIPTION OF EMBODIMENTS

Figure 1:
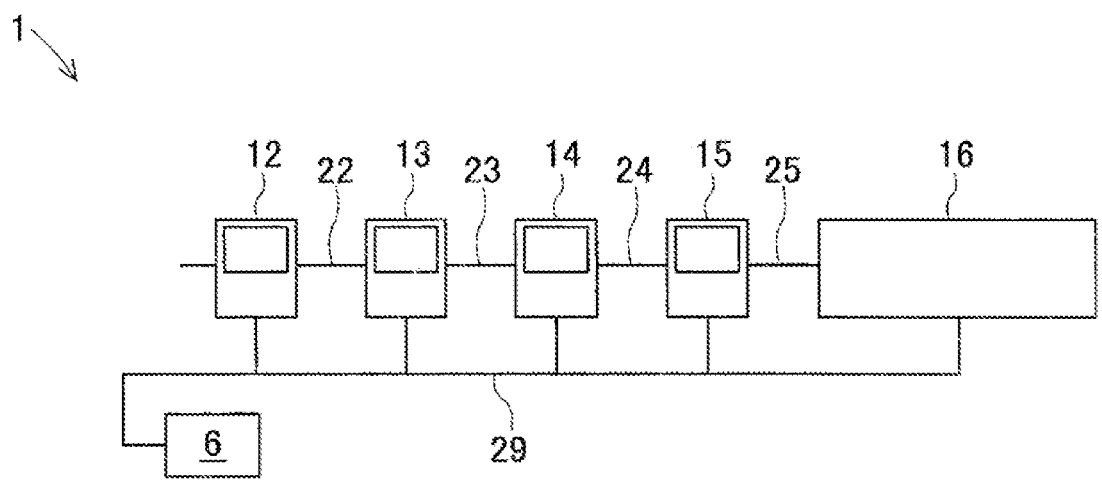
FIG. 1 is a diagram schematically illustrating a configuration of a substrate manufacturing line including a substrate manufacturing machine of a first embodiment.

1. Configuration of Substrate Manufacturing Line 1 and Substrate Manufacturing Machine of First Embodiment A substrate manufacturing machine of a first embodiment will be described with reference to FIGS. 1 to 3. FIG. 1 is a diagram schematically illustrating a configuration of substrate manufacturing line 1 including the substrate manufacturing machine of the first embodiment. Substrate manufacturing line 1 includes five substrate manufacturing machines that share the manufacturing of substrate. More specifically, substrate manufacturing line 1 is configured by arranging solder printer 12, printing inspector 13, component mounter 14, substrate appearance inspection machine 15, and reflow machine 16 in a row.

The five substrate manufacturing machines are communicatively connected to each other by using communication line 29. In addition, the five substrate manufacturing machines are communicatively connected to administrator terminal 6 by using communication line 29. Bidirectional communication is possible between the substrate manufacturing machines and between the substrate manufacturing machine and administrator terminal 6. Administrator terminal 6 is used by a manufacturing manager. The manufacturing manager formulates and changes a manufacturing plan of multiple substrate types to be manufactured in substrate manufacturing line 1. Further, the manufacturing manager notifies the relevant departments of the manufacturing plan and promotes the execution of the manufacturing plan.

Solder printer 12 prints a paste-like solder on the substrate in a predetermined pattern shape. Solder printer 12 and printing inspector 13 are connected to each other by substrate conveyance device 22. Printing inspector 13 inspects the solder printing state of the conveyed substrate. Printing inspector 13 and component mounter 14 are connected to each other by substrate conveyance device 23. Component mounter 14 mounts the component on the solder of the conveyed substrate. Component mounter 14 and substrate appearance inspection machine 15 are connected to each other by substrate conveyance device 24.

Substrate appearance inspection machine 15 inspects an appearance state of the component mounted on the conveyed substrate. Substrate appearance inspection machine 15 and reflow machine 16 are connected to each other by substrate conveyance device 25. Reflow machine 16 melts the solder of the substrate determined to be normal by substrate appearance inspection machine 15 and then solidifies the solder to stabilize the connection state. Accordingly, the manufacturing of the substrate is completed. The configuration of the substrate manufacturing line shown in FIG. 1 is an example, and may be a line configuration of various known forms, for example, a line configuration including multiple component mounters.

Figure 2:
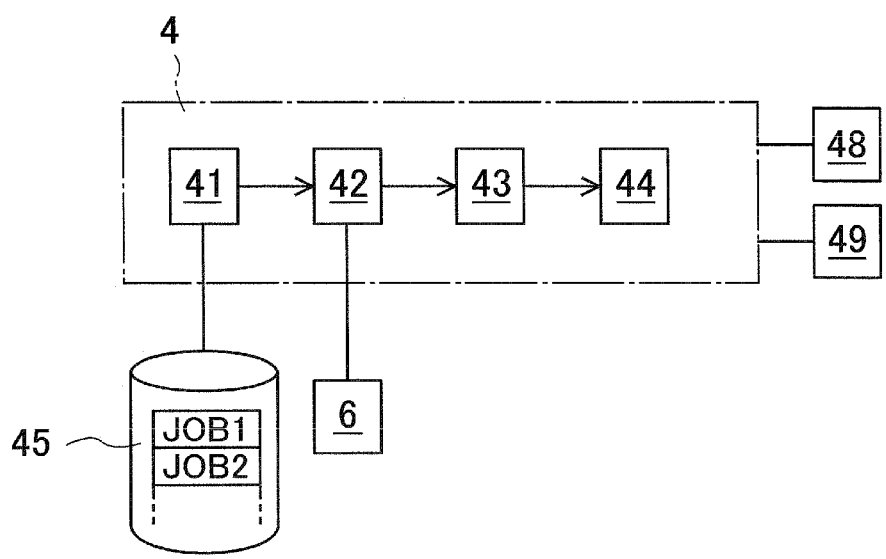
FIG. 2 is a diagram illustrating a functional configuration of a control section of a component mounter that is the substrate manufacturing machine of the first embodiment.

Solder printer 12, printing inspector 13, component mounter 14, and substrate appearance inspection machine 15 can all be the substrate manufacturing machine of the first embodiment. Hereinafter, description will be made by taking an example in which component mounter 14 is the substrate manufacturing machine of the first embodiment. Component mounter 14 includes control section 4 which controls the mounting operation of the component. Control section 4 also operates when switching the substrate type to be manufactured. FIG. 2 is a diagram illustrating the functional configuration of control section 4 of component mounter 14 which is the substrate manufacturing machine of the first embodiment.

As illustrated, control section 4 includes display section 48 and input section 49. Control section 4 includes substrate type setting section 41, substrate type checking section 42, manufacturing condition examination section 43, and manufacturing authorization section 44 as four functional sections. Substrate type setting section 41 holds multiple pieces of manufacturing job data (JOB1 and JOB2) in memory device 45. Memory device 45 may be an internal device of component mounter 14 or an external device shared by multiple substrate manufacturing machines. Substrate type checking section 42 performs bidirectional communication with administrator terminal 6. The detailed functions of the four functional sections will be described later in detail in the description of the operation and action.

Pieces of manufacturing job data (JOB1 and JOB2) are data describing detailed specifications relating to the mounting operation of the component. Pieces of manufacturing job data (JOB1 and JOB2) are data different for each substrate type. The data name and the update history information are assigned to pieces of manufacturing job data (JOB1 and JOB2). Examples of the update history information may include the number of revisions which means the number of updates and the update date. Multiple pieces of manufacturing job data having the same data name and different update history information are interpreted as different data.

For example, the data name may be "JOB1", the number of revisions may be "R0", "R1", "R2", and "X3", and the data name and the number of revisions can be concatenated by "_". In this case, four pieces of manufacturing job data are "JOB1_R0", "JOB1_R1", "JOB1_R2", and "JOB1_X3". Here, the alphabetic character R of the first character of the number of revisions represents usability, and the alphabetic character X of the first character represents prohibition. The number of the second character of the number of revisions represents the number of updates. The number of revisions with a large number of updates is determined to be preferentially used. Therefore, in this example, only "JOB1_R2" can be used as the manufacturing job data, and others cannot be used.

The three manufacturing job data that cannot be used, that is, "JOB1_R0", "JOB1_R1", and "JOB1_X3" are held in memory device 45 in consideration of the purpose of checking the changed point at the time of update and the possibility of future use. Therefore, in memory device 45, usable manufacturing job data and prohibited manufacturing job data are mixed. For this reason, there is a possibility that the operator may erroneously select the manufacturing job data.

2. Operation and Action of Substrate Manufacturing Machine of First Embodiment

Figure 3:
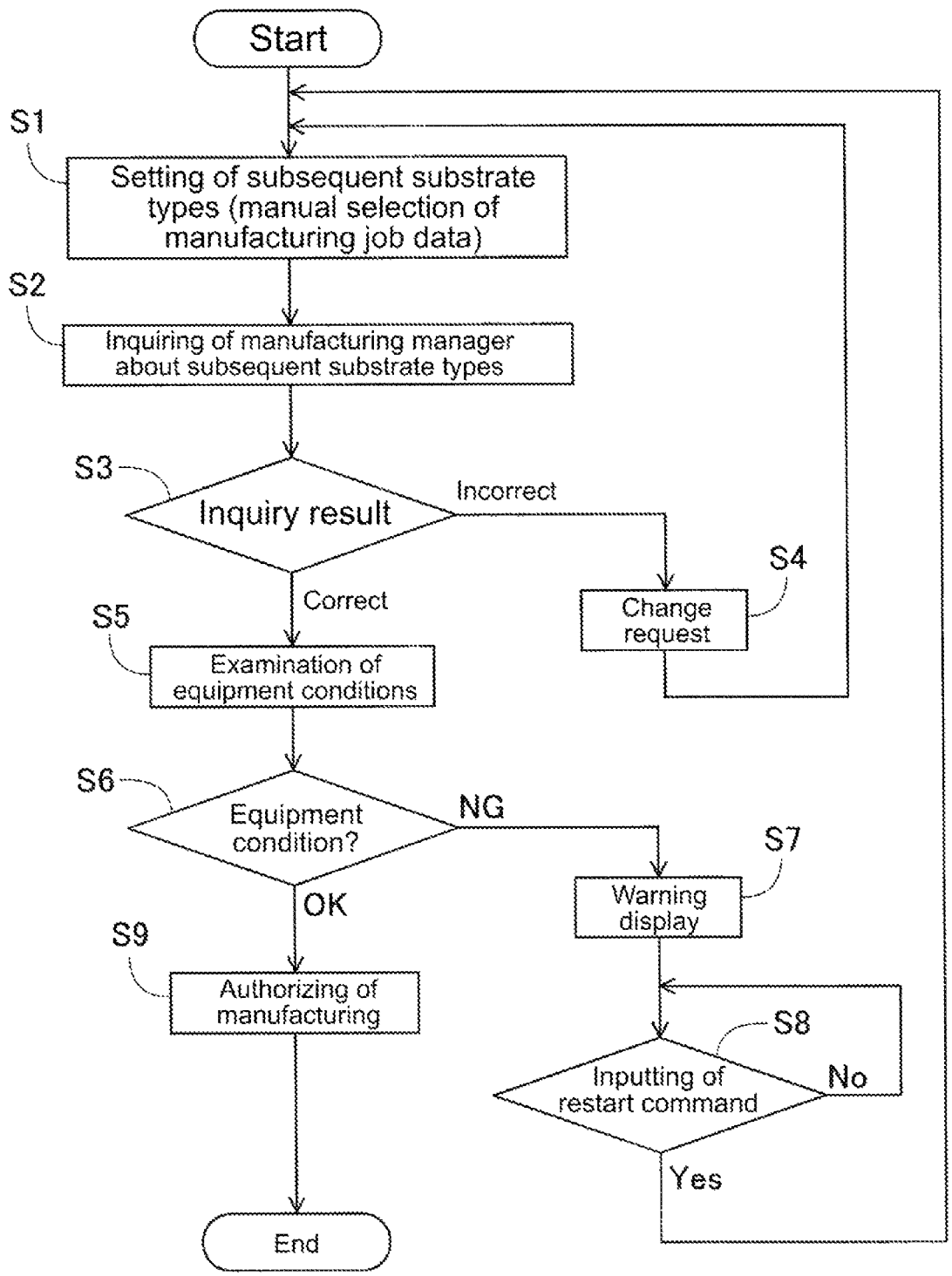
FIG. 3 is a process flowchart illustrating an operation of the control section of the component mounter that is the substrate manufacturing machine of the first embodiment.

Next, the operation and action of component mounter 14 will be described focusing on the operation of control section 4. FIG. 3 is a process flowchart illustrating the operation of control section 4 of component mounter 14 which is the substrate manufacturing machine of the first embodiment. In step S1 of FIG. 3, substrate type setting section 41 of control section 4 operates to set the subsequent substrate types to be manufactured subsequently next to the current substrate type being currently manufactured.

More specifically, substrate type setting section 41 displays a list of data names and update history information of multiple pieces of manufacturing job data (JOB1 and JOB2) on display section 48, and requests the operator to perform manual selection operations. After checking not only the data name but also the update history information, the operator selects the manufacturing job data corresponding to the subsequent substrate types from input section 49. Substrate type setting section 41 selects the manufacturing job data according to the selection operation. As a result, the setting of the subsequent substrate types is completed.

In step S2, substrate type checking section 42 operates following substrate type setting section 41. After the manufacturing of the substrate of the current substrate type is completed, substrate type checking section 42 inquires of the production manager about the subsequent substrate types set by substrate type setting section 41, and checks whether the substrate type is correct. Since the manufacturing plan is frequently changed at a point in time during the manufacturing of the current substrate type, substrate type checking section 42 does not operate.

More specifically, substrate type checking section 42 notifies administrator terminal 6 of the data name and the update history information of the manufacturing job data corresponding to the subsequent substrate types, for example, by e-mail. Alternatively, substrate type checking section 42 displays the data name and the update history information of the manufacturing job data on display section 48. The manufacturing manager compares the data name and the update history information with the latest manufacturing plan, determines that there is an error if even a single character is different, and determines that it is correct if the characters completely match each other. The manufacturing manager replies the inquiry result, that is, whether the subsequent substrate types are correct by the reply of the e-mail or the input operation from input section 49.

In the next step S3, substrate type checking section 42 checks the inquiry result, and advances the execution of the process flow to step S4 in a case where the subsequent substrate types are erroneous. In step S4, substrate type checking section 42 displays the change requests of the subsequent substrate types on display section 48 and returns the execution of the process flow to step S1. The operator who recognized the change request examines whether the manufacturing plan is changed, and also examines the setting error of the operator. Then, in the second step S1, the operator selects the manufacturing job data again based on the investigation result.

In a case where the inquired subsequent substrate types are erroneous, the manufacturing manager may reply the correct subsequent substrate types. In this case, in the second step S1, substrate type setting section 41 can set the correct subsequent substrate types based on the answer of the manufacturing manager.

In a case where the subsequent substrate types are correct in step S3, substrate type checking section 42 advances the execution of the process flow to step S5. In step S5, manufacturing condition examination section 43 operates following substrate type checking section 42. Manufacturing condition examination section 43 examines whether the equipment condition as to whether the manufacturing of the substrates of the subsequent substrate types can be started is satisfied. Manufacturing condition examination section 43 examines the in-machine state and collects information on the equipment condition.

In the next step S6, manufacturing condition examination section 43 determines the equipment condition, and advances the execution of the process flow to step S7 in a case where the condition is not satisfied. In step S7, manufacturing condition examination section 43 displays a warning display on display section 48, and advances the execution of the process flow to step S8. The operator who recognized the warning display performs a return action on component mounter 14. After the equipment condition is satisfied, the operator inputs a restart command from input section 49.

In step S8, manufacturing condition examination section 43 waits for input of a restart command. When the restart command is input, manufacturing condition examination section 43 returns the execution of the process flow to step S1. It is rare that the manufacturing plan is changed in a case where the return action of the operator is performed in a short period of time. However, the manufacturing plan is often changed in a case where the return action is performed in a long period of time. Therefore, in the returned step S1, the operator examines whether the manufacturing plan is changed, and then selects the manufacturing job data again.

In a case where the equipment condition is satisfied in step S6, manufacturing condition examination section 43 advances the execution of the process flow to step S9. In step S9, manufacturing authorization section 44 operates following manufacturing condition examination section 43. Manufacturing authorization section 44 authorizes the manufacturing of the substrates of the subsequent substrate types. As a result, the process flow of control section 4 ends. Next, the setup changing work corresponding to the subsequent substrate types is performed to prepare for manufacturing. Next, component mounter 14 starts the manufacturing of the substrates of the subsequent substrate types.

3. Aspects and Effects of Substrate Manufacturing Machine of First Embodiment

Component mounter 14 that is the substrate manufacturing machine of the first embodiment includes substrate type setting section 41 which sets the subsequent substrate types to be manufactured subsequently next to the current substrate type currently being manufactured, substrate type checking section 42 which checks whether the set subsequent substrate types are correct, manufacturing condition examination section 43 which examines whether the manufacturing condition for manufacturing the substrates of the subsequent substrate types is satisfied, and manufacturing authorization section 44 which authorizes the manufacturing of the substrates of the subsequent substrate types in a case where the subsequent substrate types are correct and the manufacturing condition is satisfied.

With this, if the set subsequent substrate types are erroneous, the manufacturing of the substrate is not authorized. In a case where the manufacturing conditions are not satisfied even if the set subsequent substrate types are correct, the manufacturing of the substrate is not authorized because there is a possibility of a change in the manufacturing plan, in other words, there is room for a change in the subsequent substrate types. Therefore, it is possible to cope with an artificial setting error or a change in the manufacturing plan and to start manufacturing after checking that the set subsequent substrate types are correct. As a result, it is possible to prevent a malfunction caused by the erroneous subsequent substrate types or a delay in the manufacturing completion timing. In addition, unnecessary setup changing work caused by the erroneous subsequent substrate types does not occur.

Further, substrate type setting section 41 holds multiple pieces of manufacturing job data (JOB1 and JOB2), being used for manufacturing the substrates of the subsequent substrate types, which are different for each substrate type, and selects manufacturing job data corresponding to the subsequent substrate types, according to the manual selection operation. With this, it is possible to set and check the subsequent substrate types by using the manufacturing job data different for each substrate type.

Further, substrate type checking section 42 checks whether the subsequent substrate types are correct, based on the data name of the manufacturing job data and the update history information assigned to the manufacturing job data. This enables to reliably detect the error of the subsequent substrate type, even in a case where the operator makes an error in setting caused by slight difference of the data name of the manufacturing job data or slight difference of the update history information.

Further, substrate type checking section 42 inquires of the manufacturing manager about the set subsequent substrate types to check whether the substrate type is correct. With this, since there is a direct inquiry to the manufacturing manager in charge of the formulation and change of the manufacturing plan, an error caused by the change in the manufacturing plan does not occur.

Further, manufacturing condition examination section 43 examines the equipment condition that is the in-machine state as to whether the manufacturing of the substrates of the subsequent substrate types can be started. With this, the manufacturing is not authorized in a case where the equipment condition is not satisfied. Therefore, in a case where the manufacturing plan is changed thereafter, the subsequent substrate types can be set again.

Figure 4:
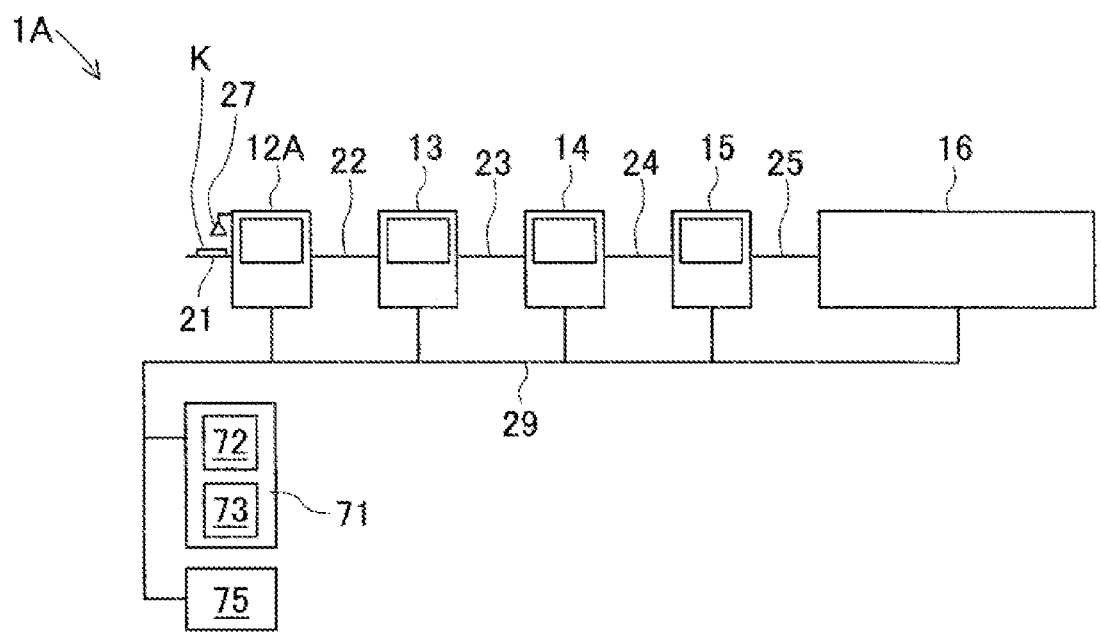
FIG. 4 is a diagram schematically illustrating a configuration of a substrate manufacturing line including a substrate manufacturing machine of a second embodiment.

4. Configuration, Operation, and Action of Substrate Manufacturing Machine of Second Embodiment Next, the differences between a substrate manufacturing machine of a second embodiment and the substrate manufacturing machine of the first embodiment will be mainly described with reference to FIGS. 4 to 6. FIG. 4 is a diagram schematically illustrating a configuration of substrate manufacturing line 1A including the substrate manufacturing machine of the second embodiment. In the second embodiment, the line configuration of substrate manufacturing line 1A is the same as that of the first embodiment. However, solder printer 12A at the head of the line becomes the substrate manufacturing machine of the second embodiment. Solder printer 12A includes substrate type reading camera 27.

Substrate type reading camera 27 is disposed facing substrate loading port 21, and images an upper surface of substrate K placed on substrate loading port 21. Code information including information of the substrate type is attached to the upper surface of substrate K. Therefore, substrate type reading camera 27 can acquire code information by performing image processing on the captured image. Solder printer 12A may be provided with a code scanner capable of reading code information and operated by an operator, instead of substrate type reading camera 27.

In the second embodiment, administrator terminal 6 is not used. Instead of that, solder printer 12A is communicatively connected to schedule management server 71 by using communication line 29. Schedule management server 71 includes manufacturing order management section 72 and personnel plan management section 73. Manufacturing order management section 72 manages the manufacturing order of the current substrate type, currently being manufactured, and the subsequent substrate types, being scheduled to be manufactured subsequently. In other words, manufacturing order management section 72 holds the execution order of the manufacturing job data of the current substrate type and the subsequent substrate types. The manufacturing manager accesses manufacturing order management section 72 to rewrite the execution order of the manufacturing job data, thereby changing the manufacturing plan. Personnel plan management section 73 manages the personnel plan of the operators in charge of substrate manufacturing line 1A.

Figure 5:
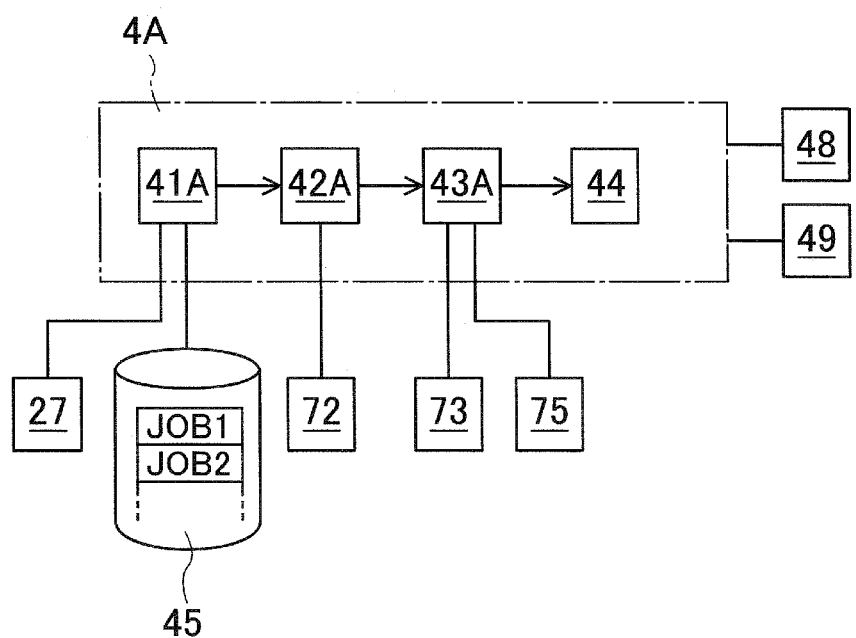
FIG. 5 is a diagram illustrating a functional configuration of a control section of a solder printer that is the substrate manufacturing machine of the second embodiment.

Further, solder printer 12A is communicatively connected to member management server 75 by using communication line 29. Member management server 75 procures and manages the members used in substrate manufacturing line 1A. Solder printer 12A includes control section 4A which controls the printing operation of solder. Control section 4A also operates when switching the substrate type to be manufactured. FIG. 5 is a diagram illustrating a functional configuration of control section 4A of solder printer 12A which is the substrate manufacturing machine of the second embodiment.

As illustrated, control section 4A includes display section 48 and input section 49. Control section 4A includes substrate type setting section 41A, substrate type checking section 42A, manufacturing condition examination section 43A, and manufacturing authorization section 44 as four functional sections. Substrate type setting section 41A holds multiple pieces of manufacturing job data (JOB1 and JOB2) in memory device 45. Substrate type setting section 41A controls substrate type reading camera 27. Substrate type checking section 42A performs bidirectional communication with manufacturing order management section 72. Manufacturing condition examination section 43A performs bidirectional communication with personnel plan management section 73 and member management server 75. Detailed functions of the four functional sections will be described in the description of the operation and action.

Figure 6:
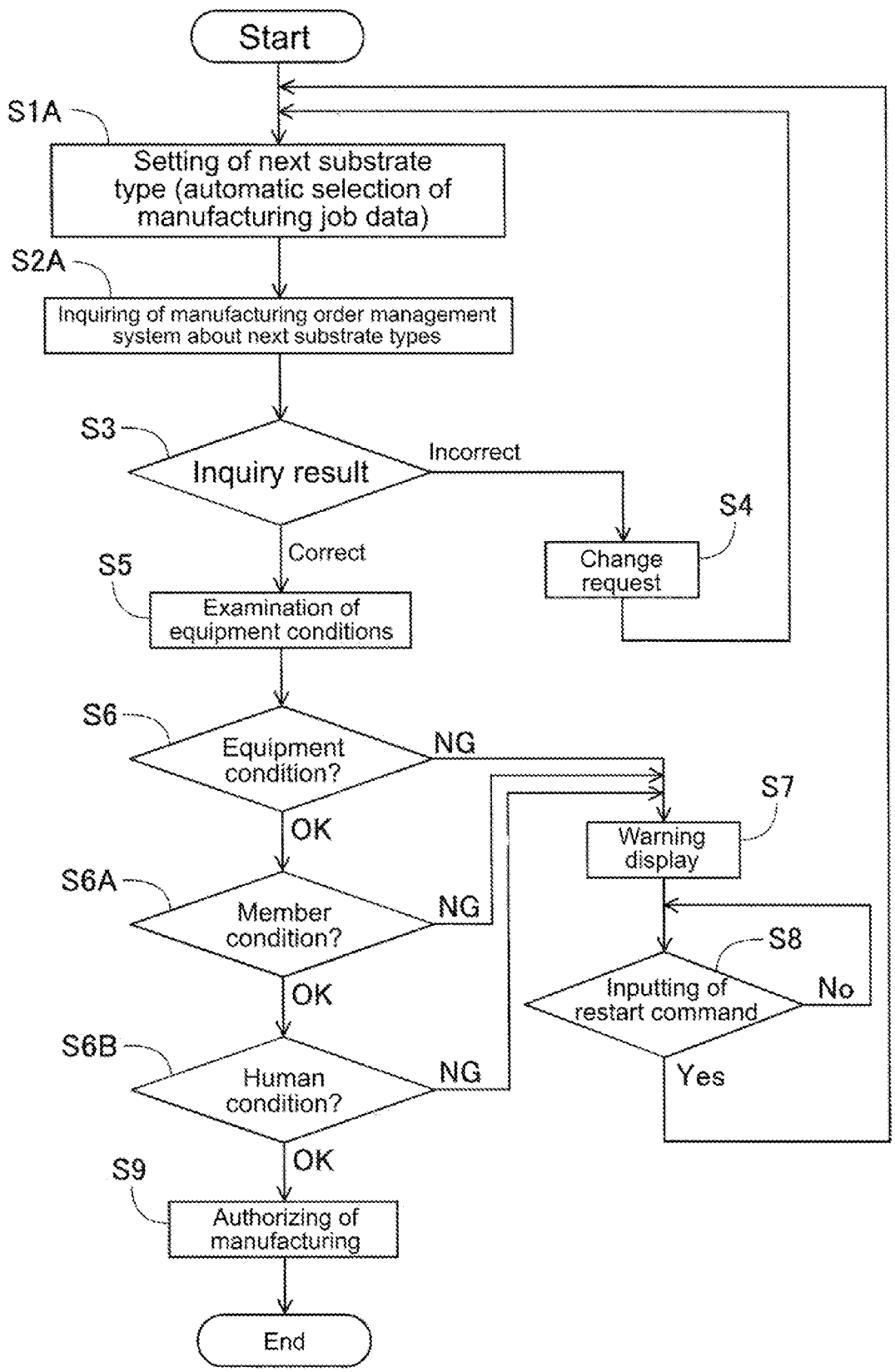
FIG. 6 is a process flowchart illustrating an operation of the control section of the solder printer that is the substrate manufacturing machine of the second embodiment.

Next, the operation and action of solder printer 12A will be described focusing on the operation of control section 4A. FIG. 6 is a process flowchart illustrating the operation of control section 4A of solder printer 12A which is the substrate manufacturing machine of the second embodiment. In step S1A of FIG. 6, substrate type setting section 41A operates to set the subsequent substrate types to be manufactured subsequently next to the current substrate type currently being manufactured.

More specifically, first, substrate type setting section 41A sends an imaging command to substrate type reading camera 27. When the operator places first substrate K of the substrate type to be manufactured next on substrate loading port 21, substrate type reading camera 27 operates. Substrate type reading camera 27 images substrate K, performs image processing on the captured image to acquire code information, and sends the code information to substrate type setting section 41A. Substrate type setting section 41A can recognize the substrate type of substrate K based on the received code information. Further, substrate type setting section 41A automatically selects the manufacturing job data corresponding to the substrate type of substrate K. As a result, the setting of the next substrate types is completed. In the second embodiment, substrate type setting section 41A subsequently sets the next substrate type, and does not set the after-next substrate type to be manufactured after the next.

In step S2A, substrate type checking section 42A operates following substrate type setting section 41A. After the manufacturing of the substrate of the current substrate type is completed, substrate type checking section 42A checks whether the next substrate type set by substrate type setting section 41A is correct. Specifically, substrate type checking section 42A inquires of manufacturing order management section 72 about the manufacturing job data automatically selected by substrate type setting section 41A through communication to check whether the manufacturing job data is correct. Manufacturing order management section 72 determines whether the inquired manufacturing job data and the manufacturing job data held by manufacturing order management section 72 are correct depending on whether the data name and the update history information completely match each other. Manufacturing order management section 72 replies the inquiry result, that is, whether the next substrate type is correct, by communication. Manufacturing order management section 72 may answer the correct manufacturing job data in a case where the inquired manufacturing job data is erroneous.

In the next step S3, substrate type checking section 42A checks the inquiry result, and advances the execution of the process flow to step S4 in a case where the next substrate type is erroneous. In step S4, substrate type checking section 42A displays a change request of the next substrate type on display section 48, and returns the execution of the process flow to step S1A. The operator who recognized the change request examines whether the manufacturing plan is changed, and also examines the setting error of the operator. Then, in the second step S1A, the operator places a substrate of a substrate type different from the previous one on substrate loading port 21 based on the investigation result.

In a case where the next substrate type is correct in step S3, substrate type checking section 42A advances the execution of the process flow to step S5. In step S5, manufacturing condition examination section 43A operates following substrate type checking section 42A. Manufacturing condition examination section 43 examines the in-machine state and collects information on the equipment condition. In the next step S6, manufacturing condition examination section 43A determines whether the equipment condition is satisfied.

In the second embodiment, manufacturing condition examination section 43A examines whether the member condition and the human condition are satisfied in addition to the equipment condition. More specifically, in step S6A in a case where the equipment condition is satisfied, manufacturing condition examination section 43A inquires of member management server 75 about the member condition as to whether the members necessary for the manufacturing of the substrate of the next substrate type are sufficient. In step S6B in a case where the member condition is satisfied, manufacturing condition examination section 43A inquires of personnel plan management section 73 about the human condition as to whether the operators necessary for the manufacturing of the substrate of the next substrate type are sufficient. In a case where even one of the equipment condition, the member condition, and the human condition is not satisfied, manufacturing condition examination section 43A advances the execution of the process flow to step S7.

In step S7, manufacturing condition examination section 43A displays a warning display on display section 48, and advances the execution of the process flow to step S8. The operator who recognized the warning display examines the condition which is not satisfied, consults with the manufacturing manager as necessary, and performs the action which satisfies the above-mentioned three conditions. After the three conditions are satisfied, the operator inputs a restart command from input section 49.

In step S8, manufacturing condition examination section 43A waits for input of a restart command. When the restart command is input, manufacturing condition examination section 43A returns the execution of the process flow to step S1A. In a case where the action of the operator is performed in a short period of time, the manufacturing plan is rarely changed. However, in a case where the action of the operator is performed in a long period of time, the manufacturing plan is often changed. Therefore, in the returned step S1A, the operator examines whether the manufacturing plan is changed, and then places substrate K or another substrate on substrate loading port 21.

In a case where the three conditions are satisfied, manufacturing condition examination section 43A advances the execution of the process flow to step S9. In step S9, manufacturing authorization section 44 operates following manufacturing condition examination section 43A. Manufacturing authorization section 44 authorizes the manufacturing of the substrate of the next substrate type. As a result, the process flow of control section 4A ends. Subsequently, the setup changing work corresponding to the next substrate type is performed to prepare for manufacturing. Subsequently, solder printer 12A starts the manufacturing of the substrate of the next substrate type.

5. Aspects and Effects of Substrate Manufacturing Machine of Second Embodiment

In solder printer 12A which is the substrate manufacturing machine of the second embodiment, substrate type setting section 41A holds multiple pieces of manufacturing job data (JOB1 and JOB2), being used when manufacturing the substrates of the subsequent substrate types, which are different for each substrate type, and selects manufacturing job data corresponding to the next substrate type according to the automatic selection function. With this, it is possible to set and check the subsequent substrate types by using the manufacturing job data different for each substrate type. In addition, since the operator does not set the next substrate type, the operator does not make an error in setting due to a slight difference in the data name and the update history information of the manufacturing job data.

Further, substrate type checking section 42A inquires of manufacturing order management section 72, managing the manufacturing order of multiple substrate types, about the set next substrate type to check whether the subsequent substrate types are correct. With this, since manufacturing order management section 72 that is the basis of the manufacturing plan is directly inquired, an error does not occur.

Further, manufacturing condition examination section 43A examines: the member condition as to whether the members necessary for the manufacturing of the substrates of the subsequent substrate types are sufficient; the human condition as to whether the operators necessary for the manufacturing of the substrates of the subsequent substrate types are sufficient, and the equipment condition that is the in-machine state as to whether the manufacturing of the substrates of the subsequent substrate types can be started. With this, in a case where any of the three conditions is not satisfied, the manufacturing is not authorized. Therefore, in a case where the manufacturing plan is changed thereafter, the subsequent substrate types can be set again.

6. Substrate Manufacturing Line 1B of Embodiment

Figure 7:
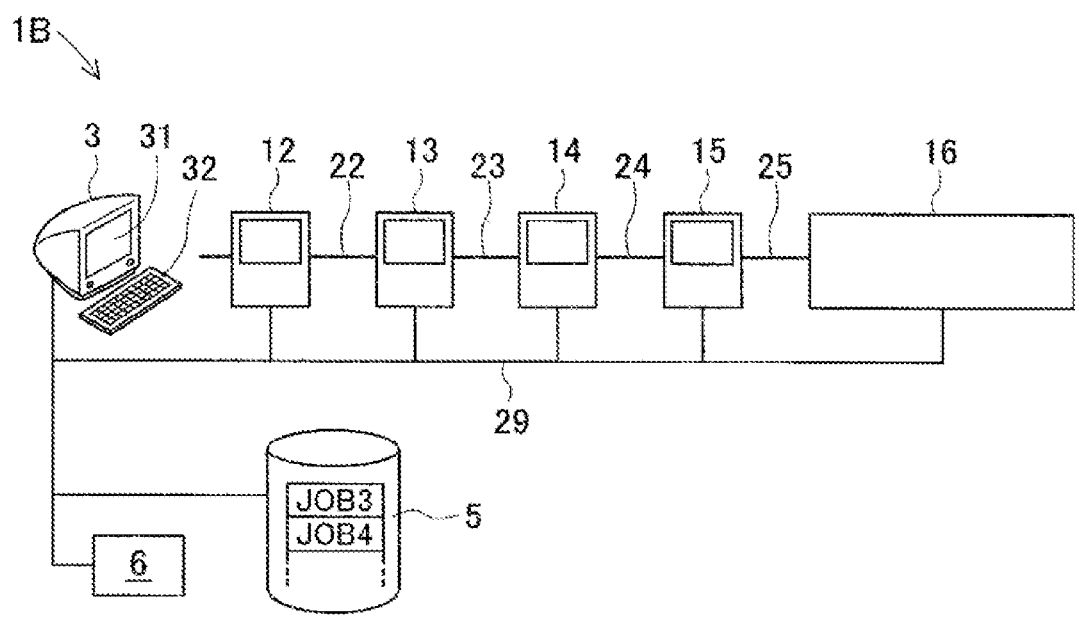
FIG. 7 is a diagram schematically illustrating a configuration of a substrate manufacturing line of an embodiment.

Next, the differences between substrate manufacturing line 1B of an embodiment and the substrate manufacturing machines of the first and second embodiments will be mainly described. FIG. 7 is a diagram schematically illustrating a configuration of substrate manufacturing line 1B of the embodiment. Substrate manufacturing line 1B includes five substrate manufacturing machines (12, 13, 14, 15, and 16) that share the manufacturing of the substrate, and line management device 3. However, each of substrate manufacturing machines (12, 13, 14, 15, and 16) does not hold manufacturing job data, and also does not have four functional sections (41, 41A, 42, 42A, 43, 43A, and 44).

Line management device 3 is configured by using a computer device. Line management device 3 includes display section 31 and input section 32. Line management device 3 is communicatively connected to each of the substrate manufacturing machines (solder printer 12, printing inspector 13, component mounter 14, substrate appearance inspection machine 15, and reflow machine 16) by using communication line 29. Line management device 3 is also communicatively connected to administrator terminal 6. Further, line management device 3 can access manufacturing database 5 by using communication line 29.

Manufacturing database 5 stores multiple pieces of manufacturing job data (JOB3 and JOB4). Pieces of manufacturing job data (JOB3 and JOB4) are different for each substrate type to be manufactured. Pieces of manufacturing job data (JOB3 and JOB4) include five substrate manufacturing machines (12, 13, 14, 15, and 16) constituting substrate manufacturing line 1B.

Line management device 3 includes the substrate type setting section, the substrate type checking section, the manufacturing condition examination section, and the manufacturing authorization section as four functional sections that operate when switching the substrate type to be manufactured. The four functional sections operate in order as in the first embodiment. The substrate type setting section holds the data name and the update history information of multiple pieces of manufacturing job data (JOB3 and JOB4). Therefore, the substrate type setting section can set the subsequent substrate types by selecting the data name and the update history information. Similar to substrate type setting section 41 of the first embodiment, the substrate type setting section sets the subsequent substrate types according to the selecting operation of the operator.

The operation of the substrate type checking section also substantially matches the operation of substrate type checking section 42 of the first embodiment. The manufacturing condition examination section examines whether the equipment condition that is a line state as to whether the manufacturing of the substrates of the subsequent substrate types can be started is satisfied in all substrate manufacturing machines (12, 13, 14, 15, and 16). The manufacturing condition examination section collects information on the in-machine state of each of substrate manufacturing machines (12, 13, 14, 15, and 16) by using the communication, and determines the equipment condition. The manufacturing authorization section authorizes the manufacturing of the substrates of the subsequent substrate types by transmitting manufacturing job data corresponding to the subsequent substrate types from manufacturing database 5 to each of substrate manufacturing machines (12, 13, 14, 15, and 16).

Substrate manufacturing line 1B of the embodiment includes multiple substrate manufacturing machines (12, 13, 14, 15, and 16) which share the manufacturing of the substrate, and line management device 3, in which line management device 3 includes the substrate type setting section that sets the subsequent substrate types to be manufactured subsequently next to the current substrate type currently being manufactured, the substrate type checking section that checks whether the set subsequent substrate types are correct, manufacturing condition examination section that examines whether the manufacturing condition for manufacturing the substrates of the subsequent substrate types is satisfied, and the manufacturing authorization section that authorizes the manufacturing of the substrates of the subsequent substrate types in a case where the subsequent substrate types are correct and the manufacturing conditions are satisfied in all substrate manufacturing machines (12, 13, 14, 15, and 16).

With this, the permission and the non-permission of the manufacturing of the substrate are determined in the same manner as in the substrate manufacturing machine of the first embodiment. Therefore, it is possible to cope with an artificial setting error or a change in the manufacturing plan and to start manufacturing after checking that the set subsequent substrate types are correct. Further, with substrate manufacturing line 1B of the embodiment, the effects described in the first embodiment similarly occur.

Further, with substrate manufacturing line 1B of the embodiment, the manufacturing authorization section authorizes the manufacturing of the substrates of the subsequent substrate types by transmitting manufacturing job data corresponding to the subsequent substrate types to multiple substrate manufacturing machines (12, 13, 14, 15, and 16). With this, the switching of the substrate type to be manufactured is simultaneously performed in all substrate manufacturing machines (12, 13, 14, 15, and 16). Therefore, as compared with a case where the switching is performed for each substrate manufacturing machine in the first embodiment, the labor of the operator is reduced. In addition, there is no unreasonable possibility that the subsequent substrate types are different from one another among multiple substrate manufacturing machines (12, 13, 14, 15, and 16).

7. Application and Modification of Embodiment

In the substrate manufacturing machines of the first and second embodiments, substrate type checking sections (42 and 42A) operate before the start of the setup changing work; however, the present disclosure is not limited thereto. That is, even after the start of the setup changing work, if substrate type checking sections (42 and 42A) operate before the start of the manufacturing of the next substrate type, a malfunction is prevented. In addition, in substrate manufacturing line 1B of the embodiment, substrate type checking section may operate after the manufacturing job data is transmitted from manufacturing database 5 to each of the substrate manufacturing machines, and thus the malfunction is prevented. Further, in the process flow of FIG. 3 or FIG. 6, the process in a case where the inquiry result is erroneous and the manufacturing condition is not satisfied can be variously modified. The substrate manufacturing machine and substrate manufacturing line 1B of the embodiment can be applied and modified in various ways.

REFERENCE SIGNS LIST 1, 1A, 1B: substrate manufacturing line
12, 12A: solder printer
14: component mounter
27: substrate type reading camera
3: line management device
4, 4A: control section
41, 41A: substrate type setting section
42, 42A: substrate type checking section
43, 43A: manufacturing condition examination section
44: manufacturing authorization section
5: manufacturing database
72: manufacturing order management section
73: personnel plan management section
75: member management server
K: substrate
JOB1, JOB2, JOB3, JOB4: manufacturing job data

The invention claimed is:

1. A substrate manufacturing line, comprising:
multiple substrate manufacturing machines configured to share manufacturing of a substrate, the multiple substrate machines including a printing inspector; and
a line management device, wherein the line management device includes:
a controller configured to:
set subsequent substrate types to be manufactured subsequently next to a current substrate type currently being manufactured;
check whether the set subsequent substrate types are correct before manufacturing substrates of the subsequent substrate types;
examine whether a manufacturing condition for manufacturing substrates of the subsequent substrate types is satisfied;
authorize manufacturing of the substrates of the subsequent substrate types in a case where the subsequent substrate types are correct and the manufacturing condition is satisfied in the substrate manufacturing line;
control the multiple substrate manufacturing machines including the printing inspector to manufacture the substrates of the subsequent substrate types in accordance with the authorization;
acquire identifying information of a substrate to be manufactured next; and
set one of the subsequent substrate types to be manufactured subsequently next to the current substrate type currently being manufactured according to the identifying information.

2. A substrate manufacturing line, comprising:
multiple substrate manufacturing machines configured to share manufacturing of a substrate, the multiple substrate machines including a substrate appearance inspection machine; and
a line management device, wherein the line management device includes:
a controller configured to:
set subsequent substrate types to be manufactured subsequently next to a current substrate type currently being manufactured;
check whether the set subsequent substrate types are correct before manufacturing substrates of the subsequent substrate types;
examine whether a manufacturing condition for manufacturing substrates of the subsequent substrate types is satisfied;
authorize manufacturing of the substrates of the subsequent substrate types in a case where the subsequent substrate types are correct and the manufacturing condition is satisfied in the substrate manufacturing line;
control the multiple substrate manufacturing machines including the substrate appearance inspection machine to manufacture the substrates of the subsequent substrate types in accordance with the authorization;

acquire identifying information of a substrate to be manufactured next; and set one of the subsequent substrate types to be manufactured subsequently next to the current substrate type currently being manufactured according to the identifying information.

3. A substrate manufacturing line, comprising:

multiple substrate manufacturing machines configured to share manufacturing of a substrate, the multiple substrate machines including a reflow machine; and a line management device, wherein the line management device includes:

a controller configured to:

set subsequent substrate types to be manufactured subsequently next to a current substrate type currently being manufactured;

check whether the set subsequent substrate types are correct before manufacturing substrates of the subsequent substrate types;

examine whether a manufacturing condition for manufacturing substrates of the subsequent substrate types is satisfied;

authorize manufacturing of the substrates of the subsequent substrate types in a case where the subsequent substrate types are correct and the manufacturing condition is satisfied in the substrate manufacturing line;

control the multiple substrate manufacturing machines including the reflow machine to manufacture the substrates of the subsequent substrate types in accordance with the authorization;

acquire identifying information of a substrate to be manufactured next; and set one of the subsequent substrate types to be manufactured subsequently next to the current substrate type currently being manufactured according to the identifying information.

4. A method, comprising:

setting subsequent substrate types to be manufactured subsequently next to a current substrate type currently being manufactured by multiple substrate manufacturing machines including a printing inspector;

checking whether the set subsequent substrate types are correct before manufacturing substrates of the subsequent substrate types;

examining whether a manufacturing condition for manufacturing substrates of the subsequent substrate types is satisfied;

authorizing manufacturing of the substrates of the subsequent substrate types in a case where the subsequent substrate types are correct and the manufacturing condition is satisfied;

controlling the multiple substrate manufacturing machines including the printing inspector to manufacture the substrates of the subsequent substrate types in accordance with the authorization;

acquiring identifying information of a substrate to be manufactured next; and setting one of the subsequent substrate types to be manufactured subsequently next to the current substrate type currently being manufactured according to the identifying information.

5. A line management device, comprising:

a controller configured to:

set subsequent substrate types to be manufactured subsequently next to a current substrate type currently being manufactured by multiple substrate manufacturing machines including a printing inspector;

check whether the set subsequent substrate types are correct before manufacturing substrates of the subsequent substrate types;

examine whether a manufacturing condition for manufacturing substrates of the subsequent substrate types is satisfied;

authorize manufacturing of the substrates of the subsequent substrate types in a case where the subsequent substrate types are correct and the manufacturing condition is satisfied;

control the multiple substrate manufacturing machines including the printing inspector to manufacture the substrates of the subsequent substrate types in accordance with the authorization;

acquire identifying information of a substrate to be manufactured next; and set one of the subsequent substrate types to be manufactured subsequently next to the current substrate type currently being manufactured according to the identifying information.

* * * * *